(12) United States Patent
Shieh et al.

(10) Patent No.: US 9,312,835 B2
(45) Date of Patent: *Apr. 12, 2016

(54) LOAD SWITCH CONTROLLER WITH SLEW RATE CONTROL

(71) Applicant: QUALCOMM Incorporated, San Diego, CA (US)

(72) Inventors: Crown Sen Shieh, Santa Clara, CA (US); Abid Hussain, Santa Clara, CA (US); Thomas J O'Brien, Powell, OH (US)

(73) Assignee: QUALCOMM, Inc, San Diego, CA (US)

( * ) Notice: Subject to any disclaimer, the term of this patent is extended or adjusted under 35 U.S.C. 154(b) by 439 days.

This patent is subject to a terminal disclaimer.

(21) Appl. No.: 13/776,274

(22) Filed: Feb. 25, 2013

(65) Prior Publication Data

US 2013/0222028 A1 Aug. 29, 2013

Related U.S. Application Data

(60) Provisional application No. 61/603,135, filed on Feb. 24, 2012, provisional application No. 61/611,414, filed on Mar. 15, 2012.

(51) Int. Cl.
*H03K 5/12* (2006.01)
*G06F 1/26* (2006.01)
*G06F 1/32* (2006.01)

(52) U.S. Cl.
CPC .. *H03K 5/12* (2013.01); *G06F 1/26* (2013.01); *G06F 1/263* (2013.01); *G06F 1/3287* (2013.01); *Y02B 60/1282* (2013.01)

(58) Field of Classification Search
CPC ......... G06F 1/26; G06F 1/263; G06F 1/3287; H04L 27/0008; H04L 27/08; G05F 3/247; H02M 3/04; H03K 19/00353; H03K 5/12; Y02B 60/1282; Y10T 307/406
USPC ....................................................... 307/29, 31
See application file for complete search history.

(56) References Cited

U.S. PATENT DOCUMENTS

| 2004/0217750 A1 * | 11/2004 | Brown et al. ................. 323/299 |
| 2006/0198198 A1 * | 9/2006 | Fujita et al. ............... 365/185.23 |
| 2008/0055137 A1 * | 3/2008 | Yen ............................... 341/144 |
| 2008/0059816 A1 * | 3/2008 | Paniagua et al. .............. 713/300 |
| 2009/0230930 A1 * | 9/2009 | Jain et al. ...................... 323/234 |

(Continued)

FOREIGN PATENT DOCUMENTS

EP 2120123 A1 * 11/2009 ................ G05F 1/46

OTHER PUBLICATIONS

International Search Report and Written Opinion—PCT/US2013/027678—ISA/EPO—May 23, 2013 (123394WO).

*Primary Examiner* — Jared Fureman
*Assistant Examiner* — Michael Warmflash
(74) *Attorney, Agent, or Firm* — Fountainhead Law Group P.C.

(57) ABSTRACT

A power control device can generate control signals to control operation of power sources. Additional control signals control operation of load switches that can be connected to the power sources to provide secondary sources of power. The load switches can be turned in a gradual manner at rates that depend on the power sources to which they are connected. The outputs of the load switches can be monitored for overvoltage and undervoltage conditions relative to the power sources to which they are connected.

21 Claims, 12 Drawing Sheets

(56) References Cited

U.S. PATENT DOCUMENTS

| | | | |
|---|---|---|---|
| 2009/0271642 A1* | 10/2009 | Cheng et al. | 713/300 |
| 2010/0052755 A1* | 3/2010 | Rai et al. | 327/170 |
| 2010/0264890 A1* | 10/2010 | Caldwell | 323/282 |
| 2011/0078470 A1* | 3/2011 | Wang et al. | 713/320 |
| 2013/0162304 A1* | 6/2013 | Kim | G09G 3/3659 327/109 |
| 2013/0241285 A1* | 9/2013 | Shieh | H02M 3/04 307/31 |

\* cited by examiner

Fig. 2A

LOAD SWITCH CONTROLLER WITH SLEW RATE CONTROL

CROSS REFERENCE TO RELATED APPLICATIONS

The present disclosure claims priority to U.S. Provisional App. No. 61/603,135 filed Feb. 24, 2012 and U.S. Provisional App. No. 61/611,414 filed Mar. 15, 2012, the content of both of which are incorporated herein by reference in their entireties for all purposes.

BACKGROUND

Unless otherwise indicated herein, the approaches described in this section are not prior art to the claims in this application and are not admitted to be prior art by inclusion in this section.

As the complexity and energy efficiency requirements of various types of electronic devices increases due to regulatory requirements and consumer demands, conventional electronic power switches have remained markedly unchanged. For expensive, high-end electronic components that require complex and specific power switching with skew rate control, intricate sequencing and output monitoring, where cost is no object and space restrictions may be a secondary, if not tertiary, concern, various customized systems that utilize expensive and large custom components exist. FIG. 1 shows a block diagram of a conventional notebook computer power architecture.

As shown, such power architectures include a large bill of materials, which more often than not associate with significant cost. Not only is there a need in such power management systems for many low-dropout regulators (LDOs), but also many other disparate power integrated circuits (ICs) such as the CPU regulator, the dual chipset regulator, dual DDR regulator, etc. Because of the complexity and number of power management ICs required, such systems require external microcontrollers or software to control the system using many general-purpose input/out (GPIO) pins and printed circuit board (PCB) traces, all of which contribute to an increased footprint size for the PCB and, ultimately, the device that includes the power managements system.

SUMMARY

A power control device includes circuitry for generating primary power control signals and secondary power control signals to control operation of respective primary power sources and load switches that are connected to the primary power sources. The slew rate of the load switches may be controlled by the secondary power control signals based on reference voltages stored in the power control device used for operating the primary power sources.

The sequencing of the primary power control signals and the secondary power control signals may be controlled in accordance with configuration data stored in the power control device.

Monitoring circuitry may be provided to monitor the voltage levels of the primary power sources and the load switches. The monitoring circuitry may signal overvoltage and undervoltage conditions. The monitoring circuitry may be used to synchronize the sequencing of the primary power control signals and the secondary power control signals.

The following detailed description and accompanying drawings provide a better understanding of the nature and advantages of the present disclosure.

BRIEF DESCRIPTION OF THE DRAWINGS

FIG. 2A illustrates an example GUI that can be used to access configuration data.

FIG. 6A shows details for secondary power controller 304a.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
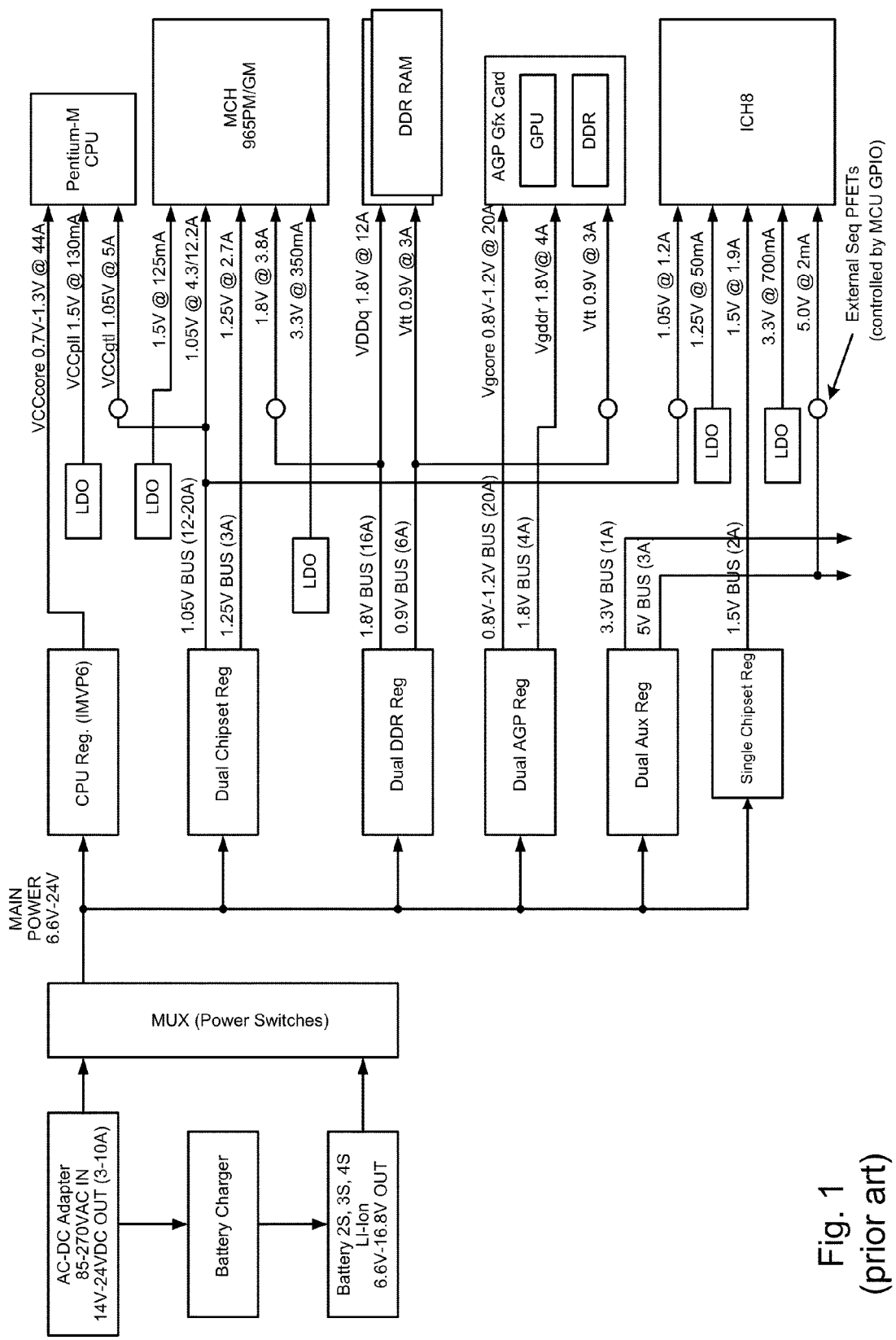
FIG. 1 illustrates a conventional configuration of power supplies in an electronic circuit.
Figure 2:
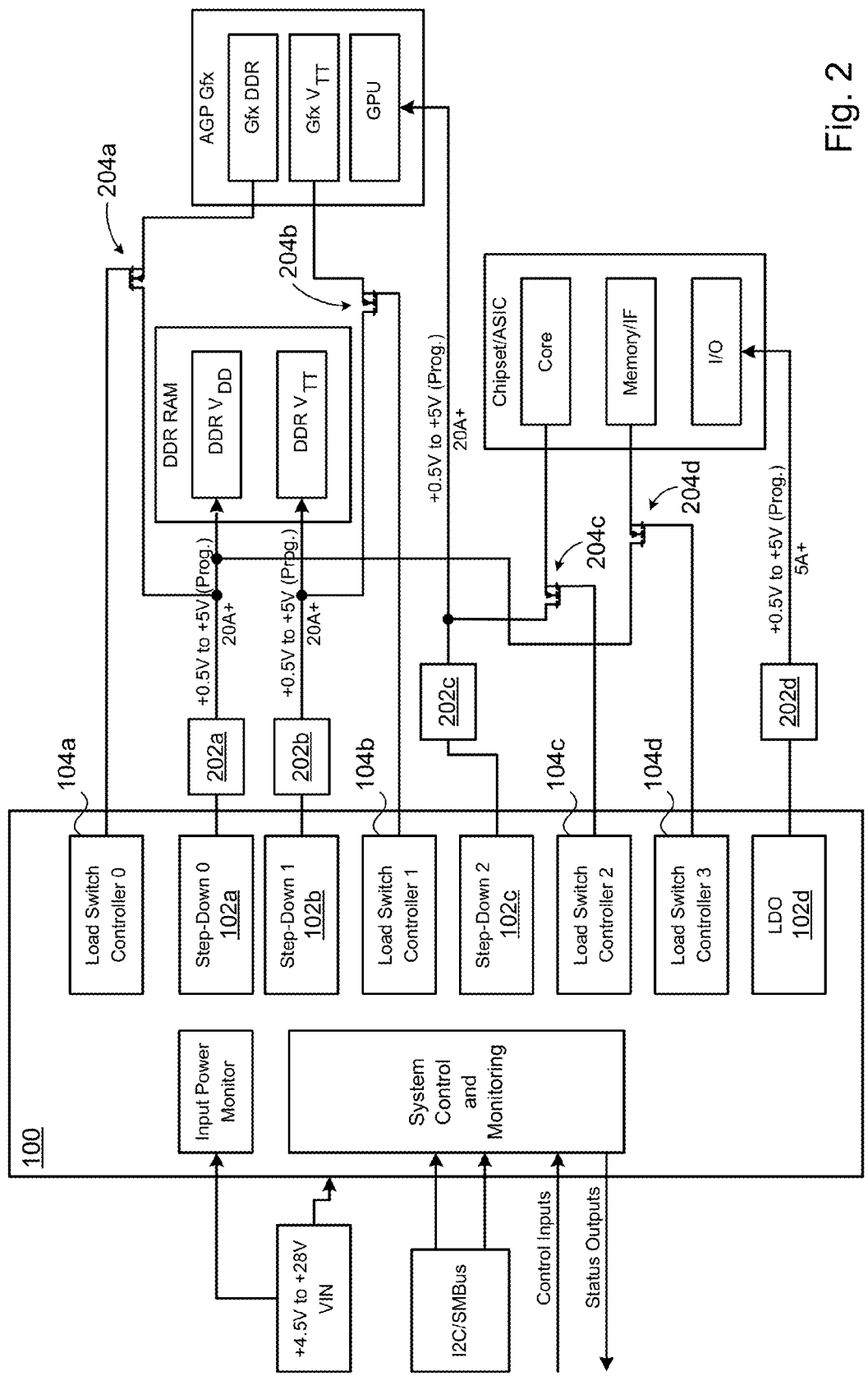
FIG. 2 illustrates a power supply configuration using a power control device in accordance with the present disclosure.
Figure 2A:
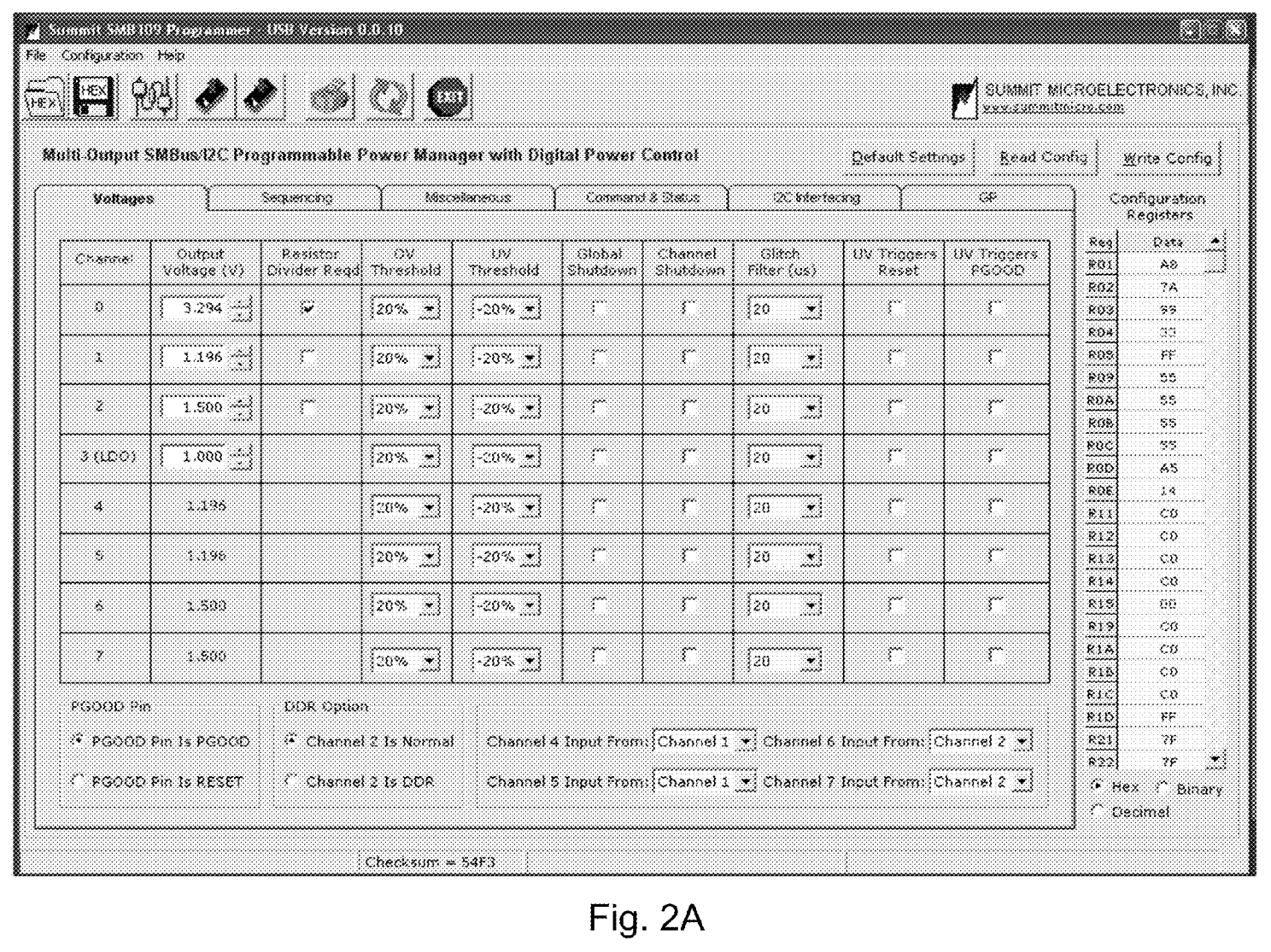

FIG. 2 shows a high level block diagram of a power control device 100 in accordance with principles of the present disclosure. The power control device 100 is shown configured in a typical power control application. The power control device 100 may receive an input voltage VIN, which in some embodiments may be 4.5V to 28V. An I$^2$C interface may be provided to allow for programmatic system control and monitoring. FIG. 2A, for example, illustrates an example of a graphical user interface (GUI) that allows a user (e.g., designer) to enter configuration data and other operating data into the power control device 100. The GUI software may communicate with the power control device 100 via the I$^2$C interface to read out data stored in the power control device and to store user-provided data into the power control device.

The power control device 100 may include control input pins and status output pins for system control and monitoring. The power control device 100 may control power sources 202a, 202b, 202c, 202d for various electronics. For instance, the example shown in FIG. 2 shows components of a computer such as a DDR RAM, an ASIC chipset, and an advance graphics processor (AGP).

In some embodiments, the power control device 100 may include one or more DC-DC power controllers 102a, 102b, 102c, 102d. The DC-DC power controllers 102a-102d may generate control signals to control operation of power sources 202a-202d such as step-down converters, low drop-out regulators, and so on. In an embodiment, for example, DC-DC power controllers 102a-102c may be controllers for buck converters, and DC-DC power controller 102d may be a controller for a low drop-out (LDO) regulator. Other configurations of DC-DC power controllers may be provided in other embodiments.

In some embodiments, the power control device 100 may include one or more load switch controllers 104a, 104b, 104c, 104d. The load switch controllers 104a-104d may generate control signals to control operation of load switches 204a, 204b, 204c, 204d that are connected to the power sources 202a-202d. Load switches 204a-204d may comprise N-channel MOSFET devices, although other load switch designs may be employed.

As can be seen in FIG. 2, the DC-DC power controllers 102a-102d may generate control signals to control operation of power sources to produce a programmatically regulated output voltage. In some embodiments, for example, the power source may produce output voltages in the range of 0.5V to 5.0V, but in other embodiments other power sources may designed to produce other voltage levels.

The load switches 204a-204d may "tap" off of the voltage outputs of power sources 202a-202d to serve as an additional source of power for other devices. In the example shown in FIG. 2, for instance, load switches 204a and 204d tap off the voltage output of power source 202a. Load switches 202b taps off of power source 202b, and load switch 202c taps off power source 202c. It can be appreciated that, in the general case, a designer may connect any load switch 204a-204d to tap power from any power source 202a-202d as called for by their particular design. Each power source 202a-202d may be configured to output a particular voltage level within a range of voltage levels. In accordance with principles of the present disclosure, the power control device 100 may provide suitable control signals to control operation of any configuration of power sources 202a-202d connected to load switches 204a-204d, FIG. 2 illustrating an example of one such configuration.

As used herein, the term "primary power source" will refer to the power sources that are controlled by the DC-DC power controllers 102a-102d, for example, power sources 202a-202d. The DC-DC power controllers 102a-102d may therefore be referred to as "primary power controllers". The term "secondary power source", likewise, will refer to load switches (e.g., 204a-204d), or equivalent devices. The load switch controllers 104a-104d may therefore be referred to as "secondary power controllers".

Figure 3:
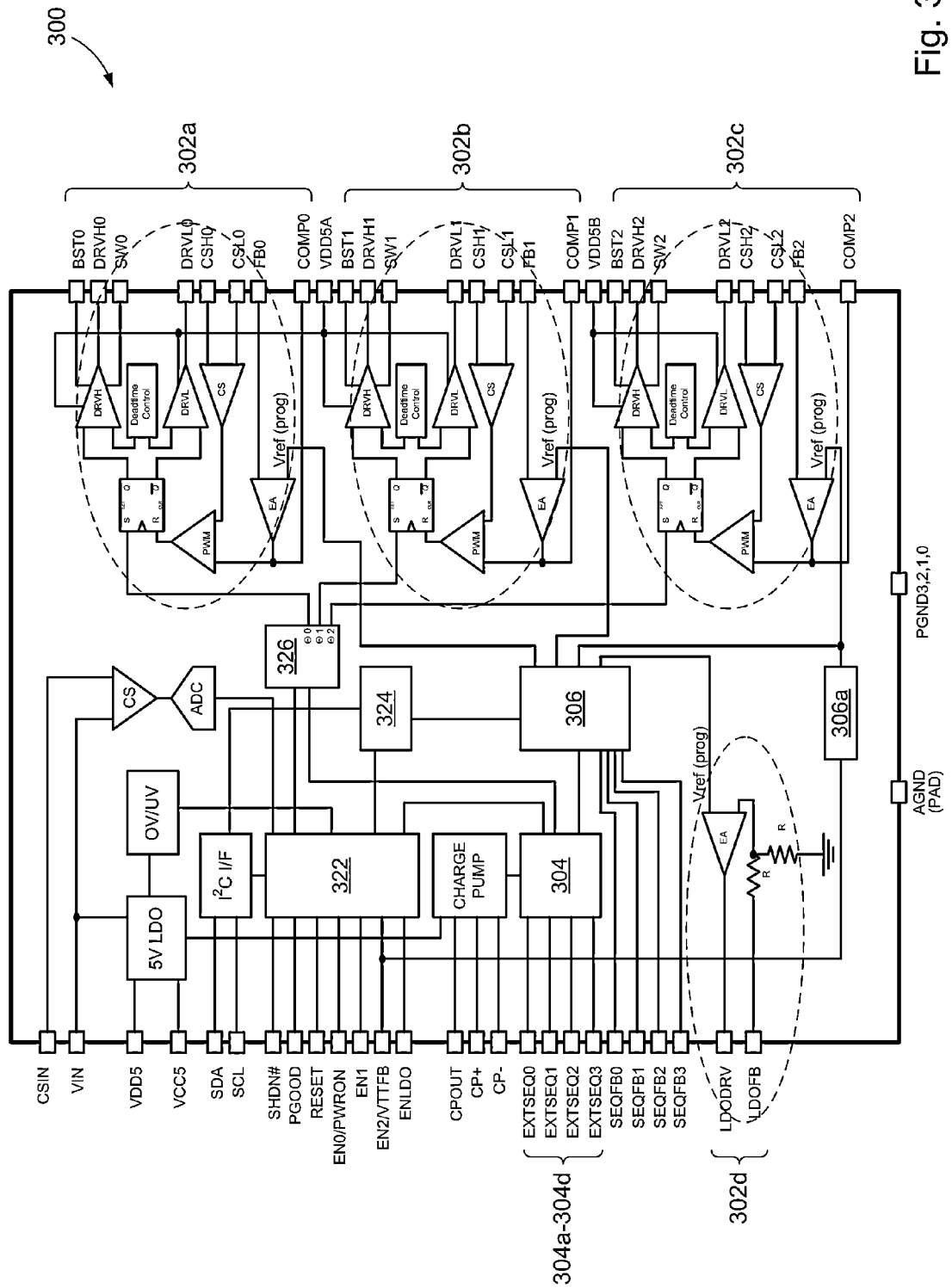
FIG. 3 illustrates some detail of a power control device in accordance with a particular embodiment of the present disclosure.

To explain various aspects of the present disclosure, reference is now made to the illustrative embodiment shown in FIG. 3. The figure shows an internal block diagram of a power control device 300 in accordance with the present disclosure as embodied in the SMB109 digital power control chip, a device that is manufactured and sold by a wholly owned subsidiary of the assignee. The power control device 300 may include primary power controllers 302a, 302b, 302c which generate control signals to control operation of respective primary power sources. In some embodiments, the primary power sources include buck converters. The pin out for each of the primary power controllers 302a-302c may include the following:

BST#—bootstrap input for connection to a bootstrap capacitor
DRVH#, DRVL#—respective high side and low side switching outputs
SW#—switch node for connection to the high side of the output inductor
CSH#, CSL#—respective high side and low side current sense inputs
FB#—voltage feedback input to a PWM controller
COMP#—a frequency compensation input where "#" is "0" for primary power controller 302a, "1" for primary power controller 302b, and "2" for primary power controller 302c.

The power control device 300 may further include a primary power controller 302d, which generates control signals to control operation of an LDO regulator, which may serve as another kind of primary power source. The pin out for primary power controller 302d includes LDODRV, which outputs the control signals to a power stage of the LDO regulator, and LDOFB, which is a feedback voltage to an LDO controller portion of the LDO regulator.

The power control device 300 may include secondary power controllers 304a, 304b, 304c, 304d, producing respective load switch control signals EXTSEQ0, EXTSEQ1, EXTSEQ2, EXTSEQ3 to control operation of respective load switches. The secondary power controllers 304a-304d may be included in module 304.

In accordance with principles of the present disclosure, the secondary power controllers 304a-304d may provide slew rate control and sequencing control of the load switches controlled by the load switch control signals EXTSEQ0, EXTSEQ1, EXTSEQ2, EXTSEQ3. By controlling the slew rate of the load switches, power from the load switches can be turned ON in a gradual manner rather than in a step fashion, thus reducing the effect of current surge both in the primary power source and in the load driven by the load switch. The sequencing control allows the load switches to be turned on in any desired order, thus providing for controlled power up of electronic systems. The sequencing control may include synchronizing the operations of the primary power controllers 302a-302d with operation of the secondary power controllers 304a-304d.

A voltage reference block 306 may provide reference voltages Vref0, Vref1, Vref2, Vref3, respectively, for the primary power controllers 302a-302d. Thus, for example, Vref0 serves as a reference voltage for primary power controller 302a, Vref1 serves as a reference voltage for primary power controller 302b, and so on. The voltage reference block 306 may be programmed to provide a different voltage level, within a range, for each reference voltage Vref0, Vref1, Vref2, Vref3. In a particular embodiment, for example, the voltage reference block 306 may output a voltage level in the range from 0.5V to 2.5V in 9.8 mV steps, for each of Vref0, Vref1, Vref2, and Vref3.

In some embodiments, the power control device 300 may include a VTT configuration block 306a in order to accept an externally provided $V_{TT}$ reference voltage (e.g., provided via the EN2/VTTFB pin) for double data rate (DDR) memory operation.

System control logic 322 may include control logic (logic gates, firmware, software, etc.) to monitor and control the various operations of the power control device 300. As will be explained below, the system control logic 322 may assert various control signals to coordinate the operations of the power control device 300.

A memory 324 may store various configuration parameters including trimming data for the internal components comprising the power control device 300. The memory 324 may store user provided configuration data that defines the configuration of the primary power controllers 302a-302d and the secondary power controllers 304a-304d. For example, the memory 324 may store data that sets a voltage level for each reference voltage Vref0, Vref1, Vref2, and Vref3. The memory 324 may include data that associates each secondary power controller 304a-304d with a primary power controller 302a-302d to which the secondary power controller is connected. For example, referring to FIG. 2 for a moment, the load switches 204a and 204c tap power from the power source 202a. The memory 324 may store data, therefore, to indicate that the load switch controllers 104a and 104c are associated with the DC-DC power controller 102a. Other configuration data that can be stored in the memory 324 may include slew rates information, sequencing information, and the like, which will be described further below.

An oscillator 326 may generate various frequency and timing related clock signals needed by the system control logic 322 to generate timing and control signals. In some embodiments, for example, the oscillator 326 may generate ramp voltages Θ0, Θ1, Θ2, for a current control loop in respective primary power controllers 302a-302c.

Figure 4A:
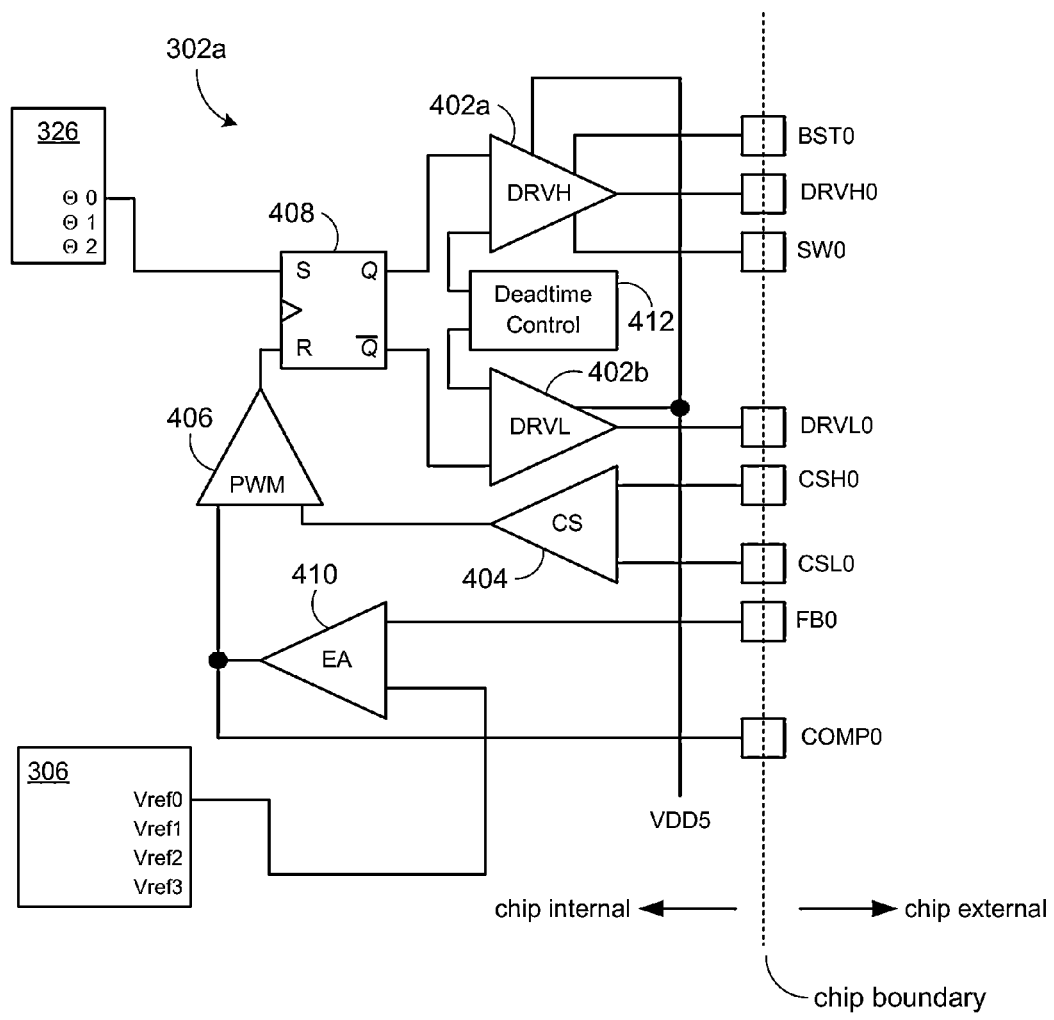
FIGS. 4A and 4B illustrates details of primary power controllers in the power control device of FIG. 3.

Referring now to FIG. 4A, additional detail for primary power controller 302a is described. It will be understood that primary power controllers 302b and 302c have similar designs. Primary power controller 302d is described in FIG. 4B. Continuing with FIG. 4A then, as explained above, in some embodiments, the primary power sources controlled by respective primary power controllers 302a-302c may be buck converters. Accordingly, the primary power controller 302a shown in FIG. 4A constitutes a feedback control stage of a buck converter. FIG. 5 shows an example of a power stage 502 of a buck converter that the primary power controller 302a may control the operation of. The power stage 502 may include a switcher circuit 502a, 502b, an inductor 502c, and an output capacitor 502d. The switches of the switcher circuit 502a, 502b may be N-channel MOSFETs.

The primary power controller 302a may include a high side driver 402a that outputs a switcher control signal DRVH0 and a low side driver 402b that outputs a switcher control signal DRVL0. The "0" designation refers components comprising primary power controller 302a; Likewise, components of primary power controllers 302b and 302c will be designated with "1" and "2", respectively. The switcher control signals DRVH0, DRVL0 may serve to drive the switcher circuit 502a, 502b shown in FIG. 5. A current sense amp 404 senses the inductor current that feeds into a PWM generator 406. A ramp voltage Θ0 from the oscillator 326 feeds into SR flip flop 408. The sensed inductor current together with the ramp voltage Θ0 constitute a current control loop for the primary power controller 302a.

The output voltage VOUT generated by the power stage 502 feeds back to error amp 410 via pin FB0 and is compared to a reference voltage Vref0 provided by the voltage reference block 306. This creates a control loop that sets the output voltage of the power stage 502 according to the reference voltage Vref0.

As explained above, the voltage reference block 306 may output a voltage level in the range from 0.5V to 2.5V. Referring to FIG. 5, if the voltage divider resistor 504 is omitted from the power stage 502, then the voltage that is fed back to the error amp 410 is VOUT. Accordingly, the primary power controller 302a will drive the switcher circuit 502a, 502b to maintain VOUT=Vref0, thus producing a voltage in the range 0.5V to 2.5V. This configuration may be referred to as "low voltage" mode operation.

On the other hand, if the voltage divider resistor 504 is provided such that a voltage divider ratio of ½ is achieved at FB0, then the voltage that is fed back to the error amp 410 is ½ VOUT. Accordingly, the primary power controller 302a will drive the switcher to maintain ½VOUT=Vref0, or VOUT=2×Vref0. To illustrate, for example, VOUT can be controlled to produce a voltage in the range 2.0V to 4.0V by programming Vref0 within the range of 1.0V-2.0V and employing the voltage divider resistor 504 with a ½ voltage divider ratio. This configuration may be referred to as "high voltage" mode operation. The memory 326 may include data that indicates, for each primary power controller 302a-302c, whether the primary power controller is configured for low voltage or high voltage operation. In some embodiments, high voltage mode operation may be defined as controlling a primary power source to generate a voltage level for VOUT in the range of 2.5V-5.0V, which can be achieved using a voltage divider resistor 504 that provides a ½ voltage divider ratio and programming the voltage reference block 306 to output a voltage level for Vref# in the range of 1.25V-2.5V.

A deadtime control circuit 412 ensures against 'shoot through' across switcher circuit 502a, 502b by preventing drivers 402a and 402b from turning ON both switcher MOSFETs at the same time.

Figure 4B:
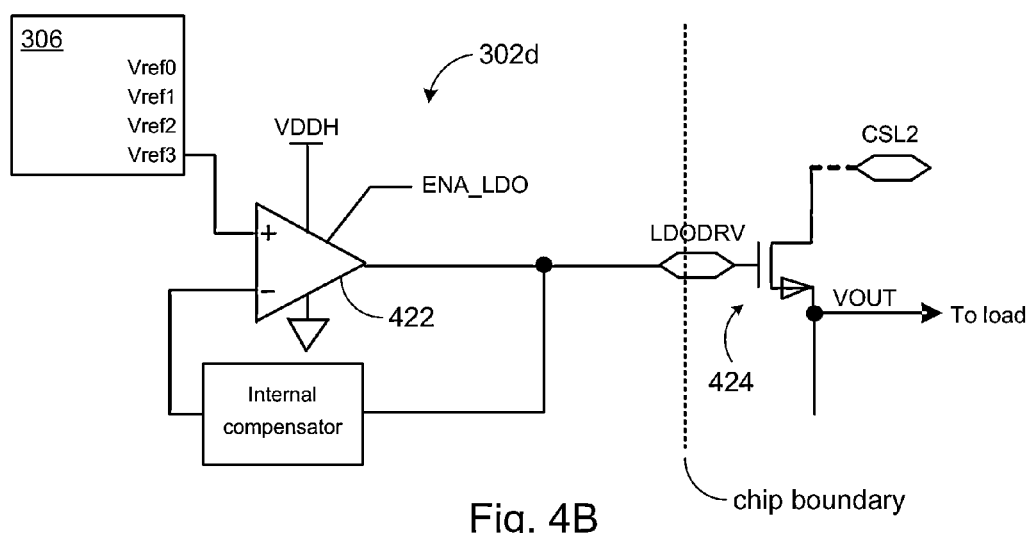
Figure 5:
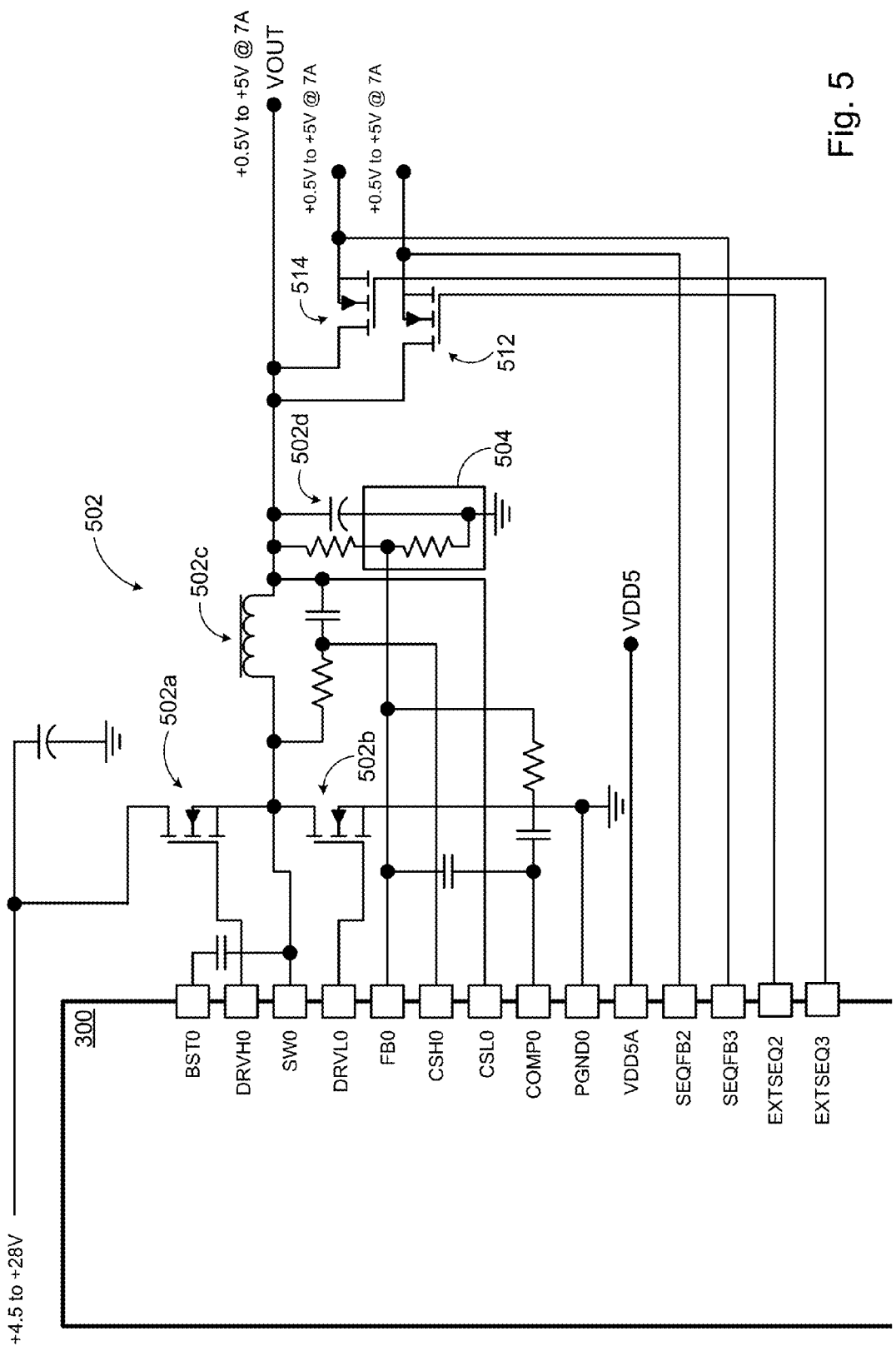
FIG. 5 illustrates an example of power stages controlled by the power control device of FIG. 3.

Referring now to FIG. 4B, the primary power controller 302d constitutes the LDO controller section of an LDO regulator. The primary power controller 302d may comprise a combined LDO amplifier and driver 422 to produce a control signal LDODRV. The LDO amplifier 422 receives a reference voltage Vref3 from the voltage reference block 306 to control a power stage comprising pass element 424 to maintain an output voltage level VOUT that is referenced to Vref3. In some embodiments, for example, the pass element 424 may be an N-channel MOSFET.

FIG. 5 illustrates a typical configuration of load switches configured as secondary power sources by tapping power from a primary power source. The figure shows two load switches 512, 514 that are connected to the output VOUT of the power stage 502. In the example shown, the load switches 512, 514 are controlled by respective load switch control signals EXTSEQ2 and EXTSEQ3. When the load switch control signals EXTSEQ2 and EXTSEQ3 turn ON respective load switches 512 and 514, power is tapped from the power stage 502 of the buck converter (primary power source) and provided to loads (not shown) connected to the load switches. The discussion will now turn to a description of the secondary power controllers 304a-304d which generate the load switch control signals EXTSEQ0, EXTSEQ1, EXTSEQ2, and EXTSEQ3.

Figure 6:
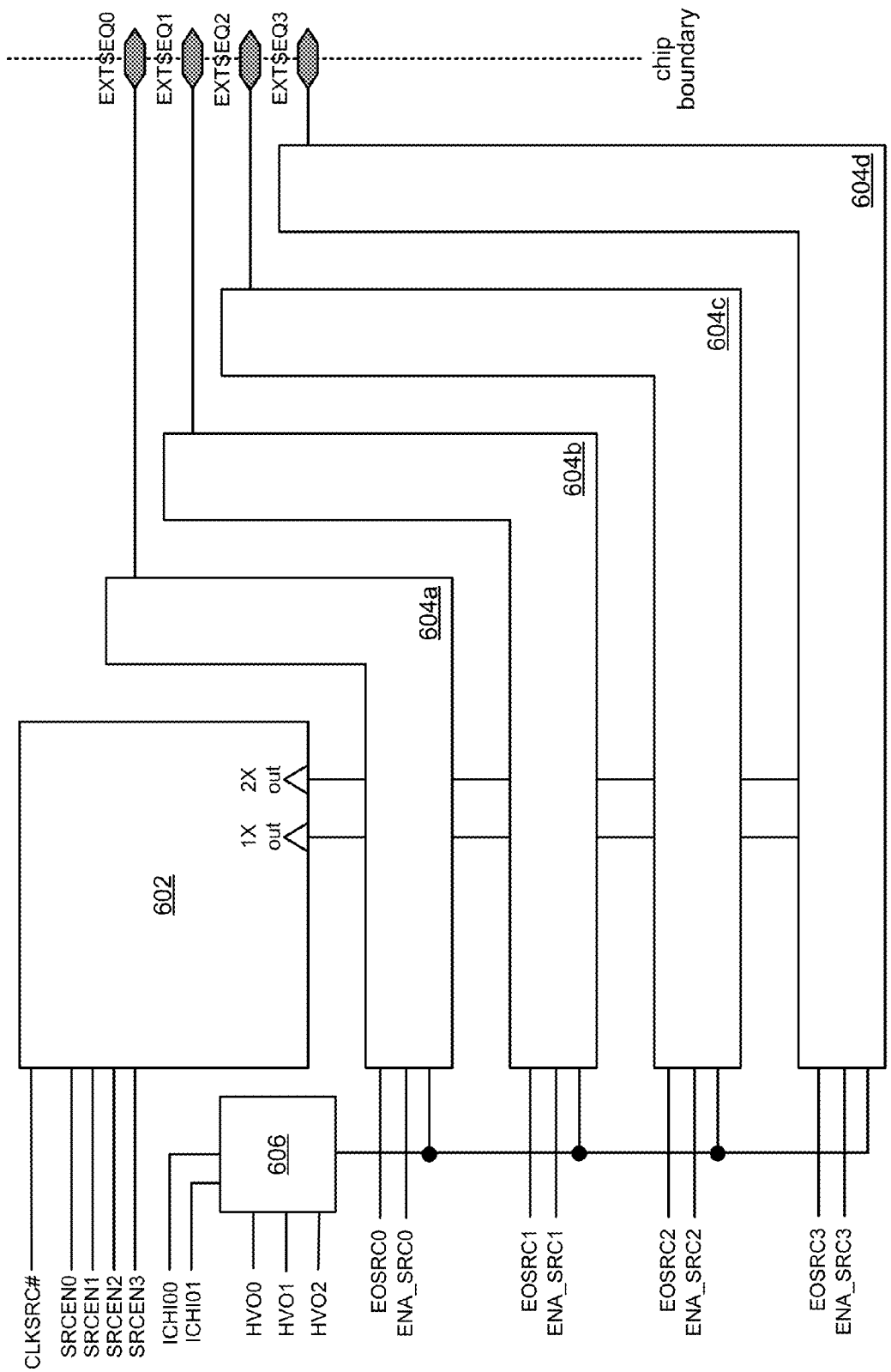
FIG. 6 illustrates an embodiment of secondary power controllers in the power control device of FIG. 3.

Referring to FIG. 6, the module 304 may comprise a slew rate unit 602, which provides two output levels: a 1× output and a 2× output. Each output of the slew rate unit 602 feeds into control units 604a, 604b, 604c, 604d, which generate respective load switch control signals EXTSEQ0, EXTSEQ1, EXTSEQ2, EXTSEQ3. Each secondary power controller 304a-304d therefore may comprise the slew rate unit 602 operating in combination with respective control units 604a-604d.

The slew rate unit 602 receives various signals from the system control logic 322. For example, a clock signal CLKSRC# provides a time base for the slew rate unit 602. The system control logic 322 may assert a separate clock signal CLKSRC# for each secondary power controller 304a-304d is active. The system control logic 322 also asserts an enable signal SRCEN0, SRCEN1, SRCEN2, SRCEN3 corresponding to the secondary power controllers 304a-304d that is active.

A mode selector 606 selects a mode indicator HVO0, HVO1, HVO2 corresponding to each primary power controller 302a-302c. The mode indicator indicates whether the corresponding primary power controller 302a-302d is operating in high voltage mode (e.g., outputs 2.5V-5.0V) or low voltage mode (e.g., outputs 0.5V-2.5V). The system control logic 322 asserts bits ICHI00 and ICHI01 to identify one of the primary power controllers 302a-302c. For example, '00'b may be associated with primary power controller 302a and thus select HVO0, '01'b may be associated with primary power controller 302b and thus select HVO1, and '10'b may be associated with primary power controller 302c and thus select HVO2. In some embodiments, the mode selector 606 may be a multiplexer (e.g., a 4:1 mux) that outputs one of the mode indicators HVO0, HVO1, or HVO2 to each of the control units 604a-604d, depending on which secondary power controllers 304a-304d is/are active and which primary power controller 302a-302c is associated with the active secondary power controller(s).

The control units 604a-604d each have corresponding enable signals (e.g., ENA_SRC0) and disable signals (e.g., EOSRC0), which the system control logic 322 may assert to coordinate with operation of the slew rate unit 602.

Figure 6A:
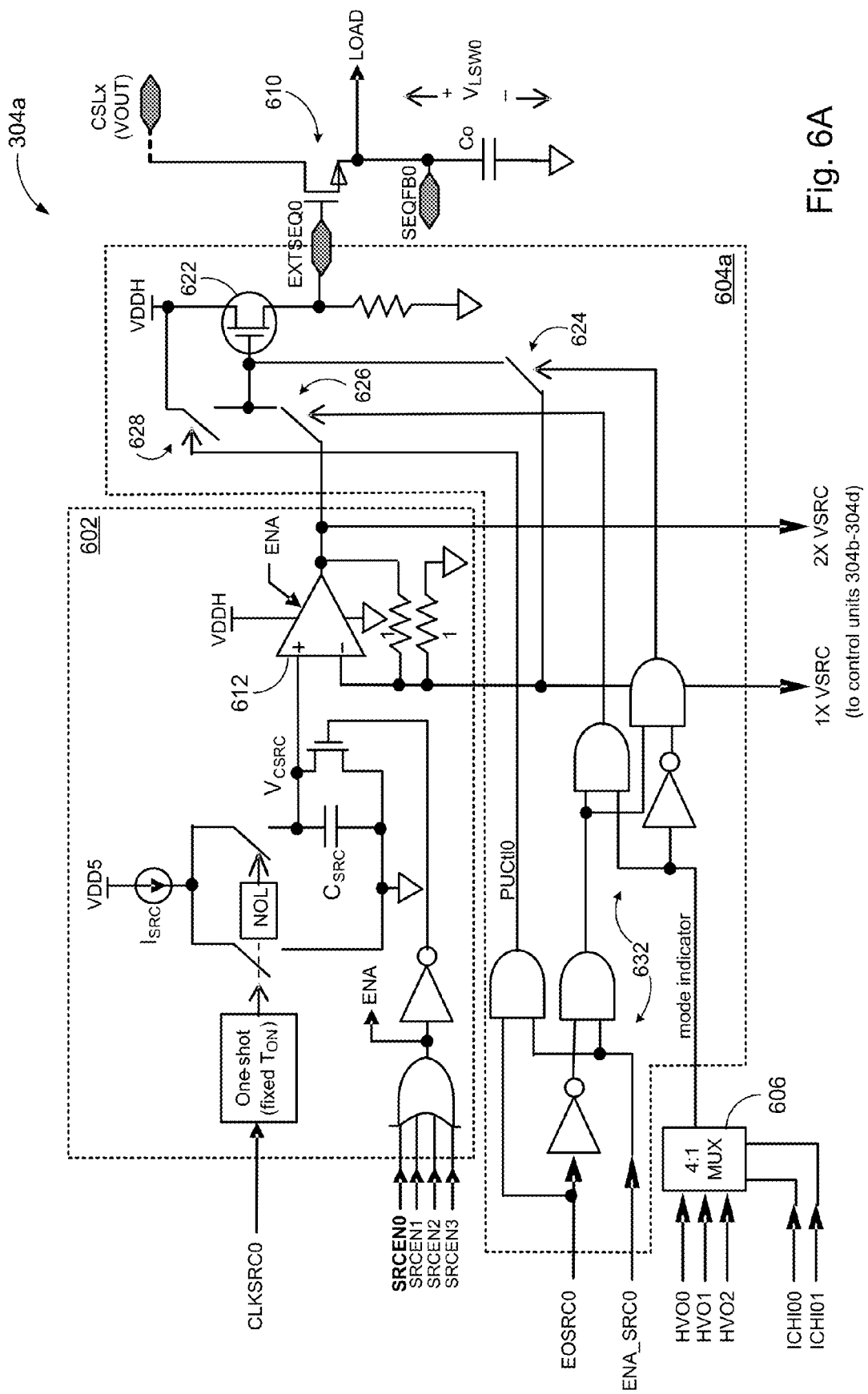

FIG. 6A shows details of the slew rate unit 602 and control unit 604a, which together operate as secondary power controller 304a. Control units 604b-604d are similarly constructed. Secondary power controller 304b comprises the combination of slew rate unit 602 and control unit 604b, secondary power controller 304c comprises the combination of slew rate unit 602 and control unit 604c, and so on.

The slew rate unit 602 includes a one-shot to generate pulses at a rate set by the incoming clock signal CLKSRC0. The one-shot operates a non-overlapping (NOL) switch to charge capacitor $C_{src}$ at a rate set by the clock signal CLKSRC0. A grounding switch connected across capacitor $C_{src}$ maintains the capacitor in a discharged state until the system control logic 322 asserts the enable signal SRCEN0. The capacitor voltage $V_{CSRC}$ feeds into a buffer 612. The buffer 612 may comprise an op-amp configured as a non-inverting amplifier with a gain factor of two. The output of the buffer 612 may be referred to as the "2× output" to reflect the 2× gain of the op-amp. Another output, called the "1× output", is taken from the resistor divider feedback network and has unity gain.

The control unit 604a includes an output driver 622 that outputs the load switch control signal EXTSEQ0, which in some embodiments may be a MOSFET device. The output driver 622 may be turned ON by closing any of three switches 624, 626, and 628. Switch 624 will connect the 1× output of buffer 612 to the gate of the output driver 622. Switch 626 will connect the 2× output of buffer 612 to the gate of output driver 622. Switch 628 will connect VDDH to the gate of output driver 622, which in some embodiments may be 10V. The signals ENA_SRC0 and EOSRC0, along with mode indicator HVO0, HVO1, or HVO2 from the mode selector 606, control the closing and opening of the switches 624-628 in accordance with the logic 632.

Operation of the secondary power controller 304a shown in FIG. 6A will now be explained in connection with the timing chart of FIG. 7. Generally, in accordance with principles of the present disclosure, the slew rate unit 602 generates a load switch control signal EXTSEQ0 that can control the slew rate of the load switch 610. This allows the load switch 610 to be turned ON in a gradual manner to a final output voltage level determined by the primary power source to which the load switch is connected. After the load switch 610 has reached its final output voltage level, the secondary power controller 304a can maintain the load switch in the ON state until it is time to be turned OFF (e.g., during a power down operation).

Figure 7:
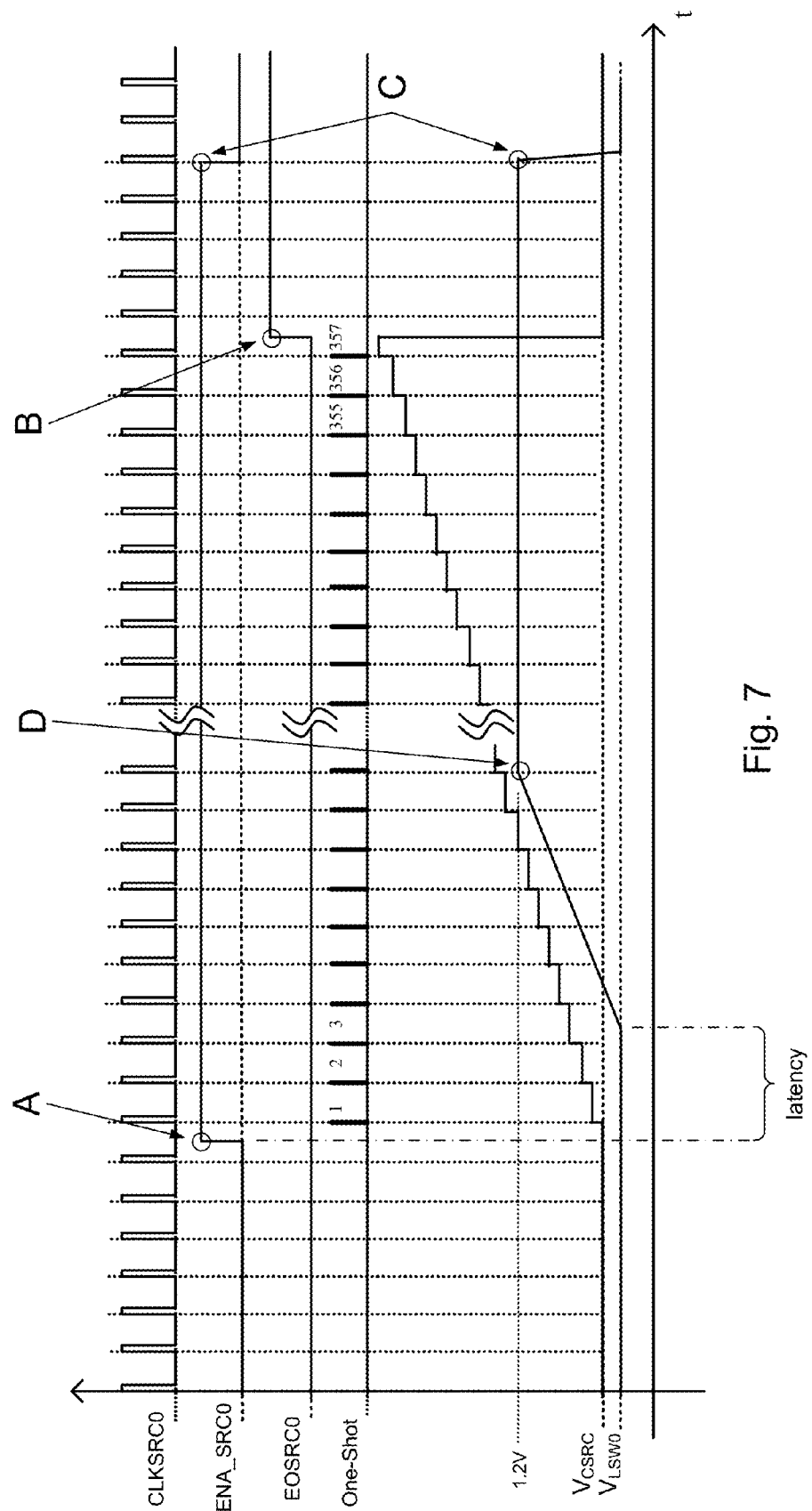
FIG. 7 illustrates a timing chart for operation of the secondary power controller of FIG. 6A.

Referring to FIG. 7, when the system control logic 322 is ready to enable secondary power controller 302a, it will assert a clock signal CLKSRC0, which will set the slew rate of the load switch 610. For example, the memory 324 may store data that represent slew rates for each secondary power controller 304a-304d. The data may be used by the system control logic 322 to generate a suitable clock signal CLKSRC#.

Asserting the clock signal CLKSRC0 will start the one-shot running. However, until the system control logic 322 asserts SRCEN0, the capacitor $C_{src}$ will not charge up. The system control logic 322 may set the ICHI00 and ICHI01 bits on the mode selector 606 according to the primary power controller 302a-302c that is associated with the secondary power controller 304a. The high voltage mode indicator HVO# of the associated primary power controller will feed through the mode selector 606 to the logic 632.

At time point A in FIG. 7, the system control logic 322 may assert ENA_SRC0 and SRCEN0 (EOSRC0 is de-asserted at this time). Depending on the high voltage mode indicator HVO#, the output driver 622 will be connected to either the 1× output via switch 624 or the 2× output via switch 626. For example, if the HVO# indicator indicates high voltage operation, then the output driver 622 will be connected to the 2× output. This aspect of the present disclosure will be discussed in more detail below.

As the one-shot charges capacitor $C_{src}$, the capacitor voltage $V_{CSRC}$ increases in a staircase fashion and starts driving the output driver 622; there may be a latency period due to open loop control. The load switch control signal EXTSEQ0 will gradually increase, thus providing slew rate control of the load switch 610 and gradually turning ON the load switch. As can be seen in FIG. 7, the voltage output $V_{LSW0}$ of the load switch 610 begins to ramp up (slew) in concert with the staircase increase of $V_{CSRC}$.

In a particular embodiment of the present disclosure, the system control logic 322 counts 357 tics of the clock signal CLKSRC0 and ramps $V_{CSRC}$ from 0V-3.5V in that period of time. This can be achieved by properly designing the pulse width of the one-shot $T_{ON}$. It will be appreciated, of course, that these design parameters are specific to a particular embodiment of the present disclosure and that other values may be used. At time point B in FIG. 7, when the last tic has been counted, the system control logic 322 asserts signal EOSRC0 to designate the end of slew rate control. When EOSRC0 is asserted, the logic 632 will cause the switches 624 and 626 to be open, and close switch 628. Switch 628 pulls the driver 622 to VDDH, which is a voltage level sufficient to fully turn ON the output driver 622 (e.g., 10V), which in turn, fully turns ON the load switch 610.

When at time point C, it is time to turn OFF the load switch 610, the system control logic 322 may de-assert ENA_SRC0. This will open switch 628 and thus turn OFF output driver 622.

Operation of the slew rate unit 602 during low voltage mode and during high voltage mode operation will now be described. Recall that the primary power controllers 302a-302c may operate in a low voltage mode in the range 0.5V-2.5V. Accordingly with reference to FIG. 6A, in low voltage mode, the drain of load switch 610 will be connected at most to VOUT=2.5V, the highest output voltage of the primary power source to which the load switch is connected in low voltage mode. As explained above, the system control logic 322 operates the slew rate unit 602 to ramp $V_{CSRC}$ from 0V-3.5V. As explained above, in low voltage mode operation, the output driver 622 is driven by the 1× output of buffer 612, which will vary from 0V-3.5V. Likewise, the load switch 610 will be driven by EXTSEQ0 to about 3.5V, taking into account the voltage thresholds $V_{th}$ of the output driver 622 and the load switch. By ramping EXTSEQ0 to about 3.5V, the slew rate unit 602 can ensure that the load switch 610 will be slewed to whatever output voltage the primary power source produces in low voltage mode by the time (e.g., time point B in FIG. 7) the system control logic asserts signal EOSRC0.

Referring to FIG. 7, for instance, the timing chart illustrates an example where the load switch 610 is connected to a primary power source that is configured to output a voltage level of 1.2V (i.e., low voltage mode). At time point D, the output voltage of the load switch 610 has slewed to 1.2V, before time point B when the output driver 622 is pulled up to VDDH by switch 628.

If, on the other hand, the primary power source to which the load switch 610 is connected is configured for high voltage mode operation, then the output voltage of the primary power source may be operated in the range of 2.5V-5.0V. As explained above, the output driver 622 will be driven by the 2× output of buffer 612 in high voltage mode because the mode indicator will indicate high voltage mode operation. The output voltage of the 2× output will range from 0.0V-7.0V. Accordingly, the load switch control signal EXTSEQ0 will ramp to about 7.0V, which ensures that the load switch 610 will be slewed to whatever output voltage the primary power source produces in high voltage mode by the time (e.g., time point B in FIG. 7) the system control logic asserts signal EOSRC0.

An aspect of the present disclosure is sequence control. In accordance with the present disclosure, the system control logic 322 may control the sequencing of the primary power controllers 302a-302d and the secondary power controllers 304a-304d, more conveniently referred to here collectively as "channels". The memory 324 may store data that can be used by the system control logic 322 to indicate the order in which to enable the channels. Generally, the channels may be enabled in any order that is suitable for a given design. In addition, one or more channels may be enabled at the same time. It will be appreciated of course that a secondary power controller should only be enabled after its associated primary power controller has been enabled previously, to ensure that the load switch controlled by that secondary power controller has power to output when the load switch is turned ON.

The following represents illustrative examples of channel activation sequences, where Pi represents the i$^{th}$ primary power controller and can be any one of primary power controllers 302a-302d. Similarly, Si represents the i$^{th}$ secondary power controller in each sequence and can be any one of secondary power controllers 304a-304d.

P1, P2, P3, P4, S1, S2, S3, S4—Here, the primary power controllers are enabled in sequence first, then the secondary power controllers are enabled in sequence.

P1, S1, P2, [S2, S3], P3, S4, P4—Here, primary power controller P1 is enabled first, followed by a secondary power controller S1, followed by another primary power controller P2, and so on. The bracket notation indicates that secondary power controllers S2 and S3 are enabled at the same time. This sequence example may be appropriate if S1 uses power from P1, S2 and S3 use power from P2, and S4 uses power from P3. Note that P4 is not associated with any secondary power controller.

P1, [S1, S2], P2, S3—This sequence illustrates that not all of the power controllers need to be enabled, showing the activation of only two of the primary power controllers and three of the secondary power controllers. For example, the design may only use two primary power sources and three secondary power sources.

An aspect of the present disclosure is synchronized operation. In accordance with the present disclosure, the system control logic 322 may synchronize the activation of a sequence of channels, in order to control when to enable subsequent channels in the sequence. The system control logic 322 may be programmed (e.g., using configuration data stored in memory 324) to use any of a number of synchronization triggers. In some embodiments, the trigger may be a time delay. For example, the system control logic 322 may be programmed to delay for some period of time after activating one channel before activating the next channel in the sequence.

In other embodiments, the system control logic 322 may use one or more pins on the power control device 300 to receive externally generated signals as the trigger. As will be described below, voltage monitoring circuitry may be provided to detect overvoltage and undervoltage conditions. During startup, the system logic 322 may use undervoltage signals as the triggers for deciding when to enable the next channel in the sequence. For example, the system control logic 322 may enable a subsequent channel the undervoltage condition for the current channel is de-asserted, or after a period of time has elapsed.

In still other embodiments, the trigger may be a communication on the I$^2$C bus (SDA pin, FIG. 3). For example, logic external to the power control device 300 may communicate a triggering message to the system control logic 322 over the I$^2$C bus.

An aspect of the present disclosure is overvoltage and undervoltage detection. In some embodiments, the power control device 300 may provide monitoring for overvoltage and undervoltage conditions on each of the primary power sources and second power sources controlled by respective primary power controllers 302a-302d and secondary power controllers 304a-340d. The power control device 300 may include monitoring circuits to monitor for overvoltage and undervoltage conditions. When any either condition occurs, a PGOOD pin (FIG. 3) may be de-asserted. The PGOOD pin may be used by logic outside of the power control device 300 to determine that an overvoltage or undervoltage condition has occurred.

Figure 8:
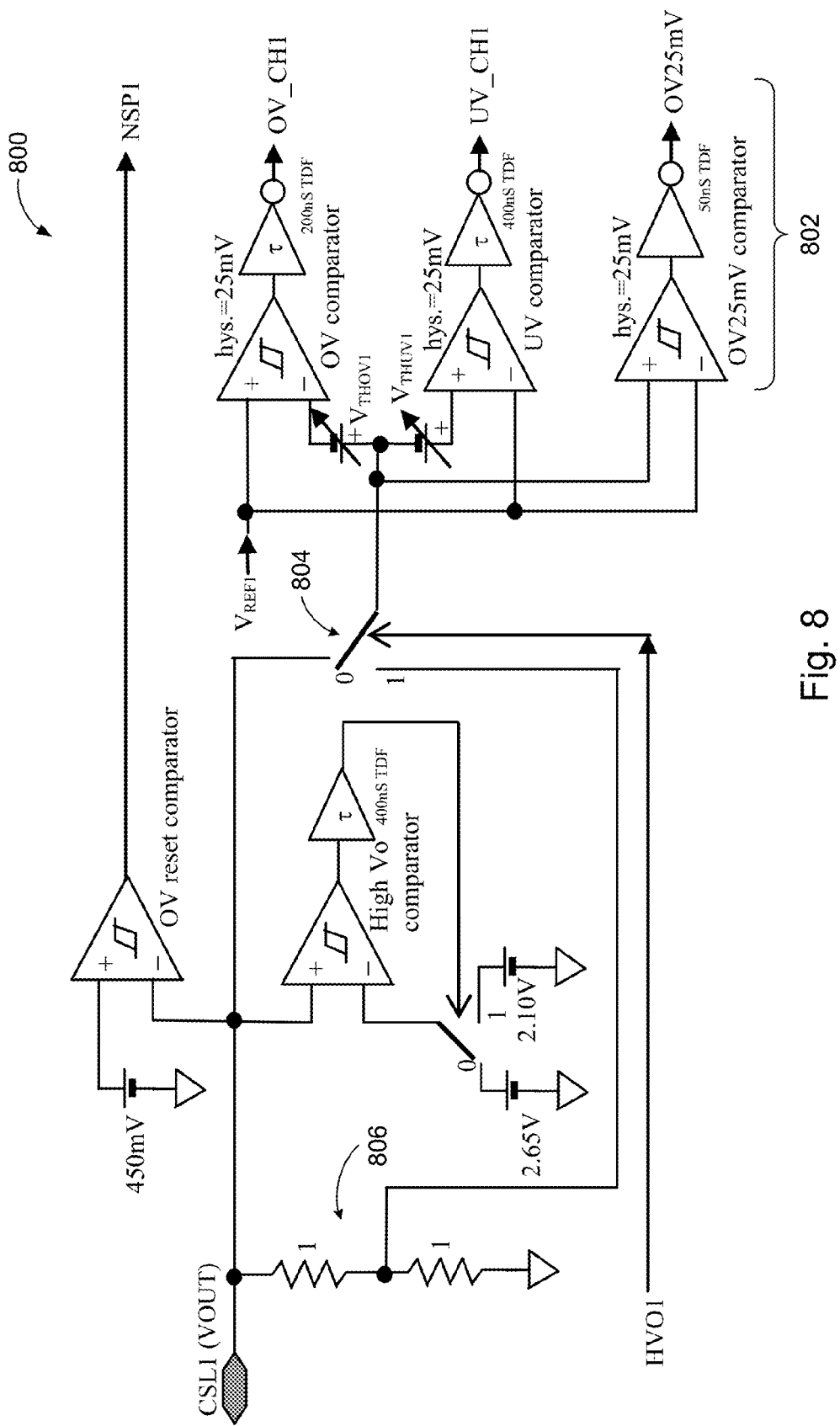
FIG. 8 illustrates an embodiment of monitoring circuit for monitoring power controlled by a primary power controller.

FIG. 8 illustrates an embodiment of monitoring circuitry 800 that can be used with the primary power controllers 302a-302d. In some embodiments, an instance of monitoring circuitry 800 is provided for each primary power controller 302a-302d. The figure shows the monitoring circuitry 800 for primary power controller 302b, as indicated by the "1" designation in the signal line labels. Similar monitoring circuitry is provided for each of the other primary power controllers.

The input pin CSL1 is connected to the output VOUT of the primary power source (e.g., power stage of buck converter, see FIG. 5) that is controlled by primary power controller 302b. A comparator section 802 compares VOUT against the reference voltage Vref1 (from voltage reference block 306) that is associated with primary power controller 302b.

The output voltage range of the voltage reference block 306 is 0.5V-2.5V. Therefore, Vref1 will be some value between 0.5V and 2.5V. Recall that each primary power source may be operated in high voltage mode (e.g., 2.5V-5.0V) or in low voltage mode (e.g., 0.5V-2.5V). Accordingly, in accordance with the present disclosure, a switch 804 will feed CSL1 or ½×CSL1 (via the voltage divider 806) to the comparator section 802, depending on whether the primary power source is operating in high voltage mode or low voltage mode as determined by the mode indicator HVO1.

The comparator section 802 may comprise an overvoltage (OV) comparator and an undervoltage (UV) comparator. The OV and UV comparators receive Vref1 from the voltage reference block 306 on their respective non-inverting and inverting inputs. $V_{THOV1}$ is a programmable threshold value for overvoltage determination. $V_{THUV1}$ is a programmable threshold value for undervoltage determination. In some embodiments, the memory 324 may store threshold data that can be used to determine $V_{THOV1}$ and $V_{THUV1}$. For example, the memory 324 may store percentage values so that $V_{THOV1}$ is determined as a percentage of Vref1 and $V_{THUV1}$ is determined as a percentage of Vref1.

The OV comparator compares Vref1 with the quantity (VOUT-$V_{THOV1}$) or the quantity (½VOUT-$V_{THOV1}$), depending on the mode indicator HVO1, and asserts signal OV_CH1 if Vref1 is less than the compared quantity to indicate an overvoltage condition. The UV comparator compares Vref1 with the quantity (VOUT+$V_{THUV1}$) or the quantity (½VOUT+$V_{THUV1}$), depending on the mode indicator HVO1, and asserts signal UV_CH1 if Vref1 is greater than the compared quantity to indicate an undervoltage condition.

The time delays of 200 nS and 400 nS provide a signal delay in case of noisy environments, where there may be small voltage fluctuations. For similar reasons, the OV and UV comparators may include hysteresis (e.g., 25 mV) to allow for small voltage fluctuations that could cause OV_CH1 and UV_CH1 to flutter.

Operation of the OV reset comparator and OV 25 mV comparator do not rely on Vref1 or the mode indicator HVO1 and thus will not be discussed.

Figure 9:
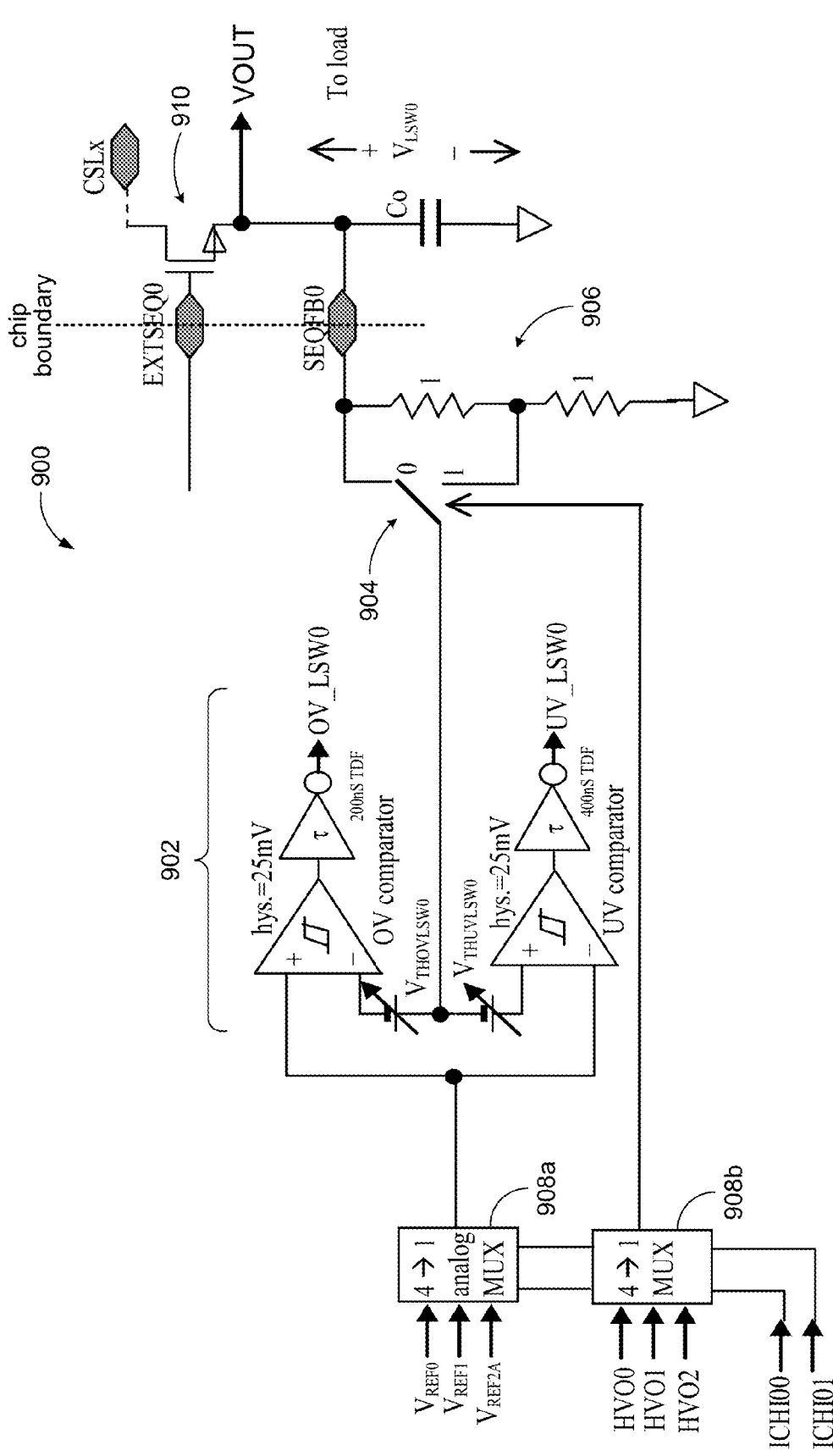
FIG. 9 illustrates an embodiment of monitoring circuit for monitoring power controlled by a secondary power controller.

FIG. 9 illustrates an embodiment of monitoring circuitry 900 that can be used with the secondary power controllers 304a-304d. In some embodiments, an instance of monitoring circuitry 900 is provided for each secondary power controller 304a-304d. The figure shows the monitoring circuitry 900 for secondary power controller 304a, as indicated by the "0" designation in the signal line labels. Similar monitoring circuitry is provided for each of the other secondary power controllers.

The input pin SEQFB0 is connected to the output VOUT of the secondary power source that is controlled by secondary power controller 304b; e.g., load switch 910. A comparator section 902 compares VOUT against a reference voltage (from voltage reference block 306) that is associated with secondary power controller 304a. The reference voltage is based on the output voltage of the power source controlled by the primary power controller that is associated with the secondary power controller 304a.

A switch 904 will feed SEQFB0 or ½×SEQFB0 (via the voltage divider 906) to the comparator section 902. The primary power source that is associated with the secondary power controller 304a may be operated in high voltage mode (e.g., 2.5V-5.0V) or in low voltage mode (e.g., 0.5V-2.5V). As explained above, however, the output voltage range of each voltage (Vref[0-2]) in the voltage reference block 306 is 0.5V-2.5V. Accordingly, if the associated primary power source is operating in high voltage mode, then switch 904 is operated by the mode indicator HVO# that corresponds to that primary power source to feed ½×SEQFB0 to the comparator section 904.

Since the secondary power controller 304a can be associated with any one of primary power controllers 302a-302c, a voltage reference selector 908a may be provided to select the reference voltage corresponding to the primary power controller that the secondary power controller is associated with. Likewise, a mode selector 908b may be provided to select the corresponding mode indicator of the associated primary power controller.

$V_{THOVLSW0}$ is a programmable threshold value for overvoltage determination. $V_{THUVLSW0}$ is a programmable threshold value for undervoltage determination. In some embodiments, the memory 324 may store threshold parameters that can be used to determine $V_{THOVLSW0}$ and $V_{THUVLSW0}$. For example, the memory 324 may store percentage values so that $V_{THOVLSW0}$ is determined as a percentage of the reference voltage selected by the voltage reference selector 908a and $V_{THUVLSW0}$ is determined as a percentage of the selected reference voltage.

The operation of the OV comparator and the UV comparator in FIG. 9 are the same as described in FIG. 8.

Figure 10:
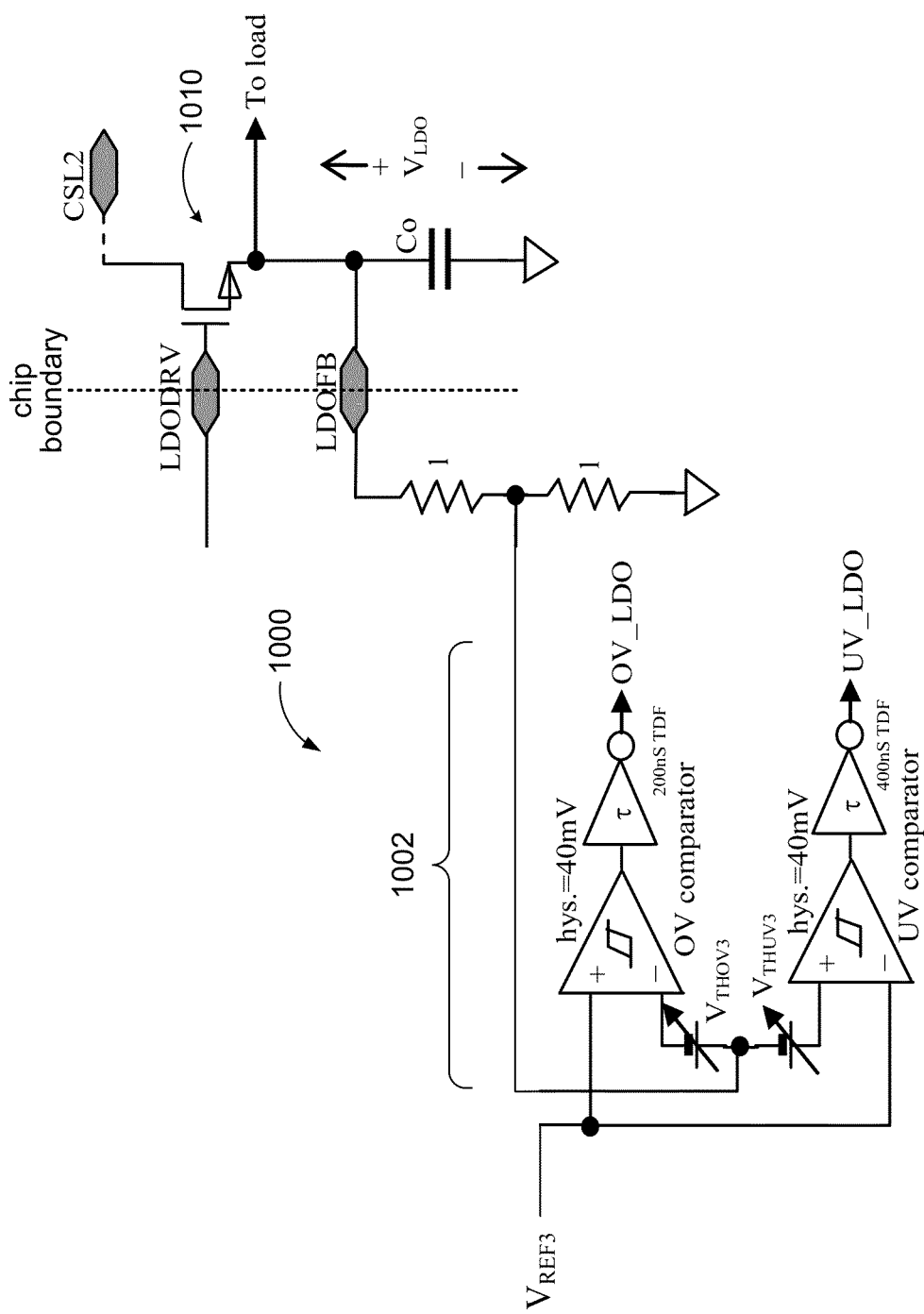
FIG. 10 illustrates an embodiment of monitoring circuit for monitoring power controlled by another primary power controller.

FIG. 10 illustrates an embodiment of monitoring circuitry 1000 that can be used with the primary power controller 302d (namely, the low dropout controller). The input pin LDOFB is connected to the output VOUT of the power stage 1010 that is controlled by primary power controller 302d. A comparator section 1002 compares VOUT against the reference voltage Vref3 from voltage reference block 306. The operation of the OV comparator and the UV comparator in FIG. 10 are the same as described in FIG. 8.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

We claim the following:

1. A circuit comprising:
a voltage reference generator having a plurality of voltage reference outputs, each voltage reference output having a selectable voltage level;
a plurality of primary power controllers, each primary power controller connected to receive a voltage reference level from one of the voltage reference outputs of the voltage reference generator, each primary power controller operative to generate switcher control signals configured to control operation of a switcher circuit to produce an output voltage that is referenced to the voltage reference level;
a plurality of secondary power controllers, each secondary power controller being associated with one of the primary power controllers, each secondary power controller operative to generate a load switch control signal configured to control a load switch to produce an output voltage based on the voltage reference level of the associated primary power controller; and
a slew rate controller operative to generate a slew rate control signal, the slew rate control signal provided to each secondary power controller, wherein the slew rate control signal determines a slew rate of the output voltage of a given secondary power controller.

2. The circuit of claim 1 wherein each secondary power controller comprises a driver that is selectively connected to and controlled by the slew rate control signal to produce the load switch control signal.

3. The circuit of claim 2 wherein the driver is further selectively controlled by a constant voltage potential to produce the load switch control signal.

4. The circuit of claim 2 further comprising a clock signal that controls an operating frequency of the slew rate controller, the clock signal being selectable depending on the secondary power controller that is connected to the slew rate controller.

5. The circuit of claim 1 further comprising a memory having stored therein association data that sets forth an association between each secondary power controller and one of the primary power controllers.

6. The circuit of claim 1 wherein the secondary power controllers are enabled one after another according to a selectable order.

7. The circuit of claim 1 wherein two or more secondary power controllers are enabled at the same time.

8. The circuit of claim 1 further comprising control logic operative to produce control signals to enable the secondary power controllers, in accordance with a selectable order, to generate load switch control signals.

9. The circuit of claim 8 wherein the control logic is further operative to produce a clock signal that controls the slew rate associated with an enabled secondary power controller.

10. The circuit of claim 8 further comprising a memory connected to the control logic and having stored therein sequence data that sets forth an order in which the secondary power controllers are enabled.

11. The circuit of claim 1 wherein a load switch that is controlled by one of the secondary power controllers is connected to a switcher circuit that is controlled by the primary power controller associated with said one of the secondary power controllers.

12. An integrated circuit device comprising:
    first circuit means for generating a plurality of primary power control signals to control operation of a plurality of respective power sources;
    second circuit means for generating a plurality of load switch control signals to control operation of a plurality of respective load switches connected to the power sources;
    third circuit means for generating a slew rate control signal, the second circuit means including connection means for selectively connecting the slew rate control signal to one of the load switches to control a slew rate of said one of the load switches; and
    fourth circuit means for storing:
        a mode indicator associated with each power source that indicates whether the first circuit means is operating said each power source in a high voltage mode or in a low voltage mode; and
        association information indicating an association between the plurality of power sources and the plurality of load switches,
    wherein the third circuit means generates the slew rate control signal based on the mode indicator of the power source associated with said one of the load switches.

13. The integrated circuit of claim 12 wherein the first circuit means comprises a plurality of primary power controller circuits, each primary power controller circuit generating corresponding primary power control signals.

14. The integrated circuit of claim 12 wherein the second circuit means comprises a plurality of control circuits, each control circuit generating a corresponding load switch control signal.

15. The integrated circuit of claim 12 further comprising a voltage reference generator to generate reference voltages used by the first circuit means to control the power sources to produce output voltages according to the reference voltages.

16. The integrated circuit of claim 15 further comprising monitoring circuitry to monitor voltage levels of the load switches controlled by the second circuit means to detect undervoltage and overvoltage conditions based on the reference voltages from the voltage reference generator to which the load switches are connected.

17. The integrated circuit of claim 12 wherein the fourth circuit means stores a slew rate parameter corresponding to each load switch, wherein the third circuit means generates a first slew rate control signal using the slew rate parameter corresponding to the load switch that is controlled by the first slew rate control signal.

18. A method in a circuit comprising:
    storing configuration data in the circuit indicative of a plurality of reference voltage levels associated with a plurality of power sources;
    generating within the circuit a plurality of primary control signals to operate the power sources according to their corresponding reference voltage levels to output corresponding first voltage levels;
    generating within the circuit a plurality of secondary control signals to operate a plurality of load switches connected to the primary power sources to produce corresponding second voltage levels; and
    generating a slew rate control signal, wherein the slew rate control signal determines a slew rate of the second voltage level produced by a given secondary control signal operating one of the plurality of load switches.

19. The method of claim 18 further comprising controlling power sources that are connected to the circuit using the primary control signals and controlling load switches that are connected to the circuit using the secondary control signals.

20. The method of claim 18 further comprising storing configuration data in the circuit indicative of a sequence by which the primary control signals and the secondary control signals are generated.

21. The method of claim 18 further comprising monitoring output voltage levels of the load switches and using the reference voltage levels stored in the circuit to trigger an undervoltage signal or an overvoltage signal based on comparisons of the output voltage levels of the load switches and the stored reference voltage levels.

* * * * *